US012772489B2

(12) United States Patent
Dura et al.

(10) Patent No.: US 12,772,489 B2
(45) Date of Patent: Oct. 20, 2026

(54) MOSFET TRANSISTOR

(71) Applicants: STMicroelectronics (Rousset) SAS, Rousset (FR); STMicroelectronics (Crolles 2) SAS, Crolles (FR)

(72) Inventors: Julien Dura, Rousset (FR); Franck Julien, La Penne sur Huveaune (FR); Julien Amouroux, Aix en Provence (FR); Stephane Monfray, Eybens (FR)

(73) Assignees: STMicroelectronics (Rousset) SAS, Rousset (FR); STMicroelectronics (Crolles 2) SAS, Crolles (FR)

( * ) Notice: Subject to any disclaimer, the term of this patent is extended or adjusted under 35 U.S.C. 154(b) by 379 days.

(21) Appl. No.: 18/386,159

(22) Filed: Nov. 1, 2023

(65) Prior Publication Data

US 2024/0154034 A1 May 9, 2024

(30) Foreign Application Priority Data

Nov. 4, 2022 (FR) ....................................... 2211477

(51) Int. Cl.

| | |
|---|---|
| ***H10D 30/63*** | (2025.01) |
| ***H10D 86/00*** | (2025.01) |
| ***H10D 86/01*** | (2025.01) |
| ***H10P 30/20*** | (2026.01) |
| ***H10P 32/10*** | (2026.01) |
| ***H10P 32/14*** | (2026.01) |

(52) U.S. Cl.
CPC ........... *H10D 30/637* (2025.01); *H10D 86/01* (2025.01); *H10D 86/201* (2025.01); *H10P 30/204* (2026.01); *H10P 30/21* (2026.01); *H10P 32/1406* (2026.01); *H10P 32/171* (2026.01)

(58) Field of Classification Search
CPC .... H10D 30/637; H10D 86/01; H10D 86/201; H10D 30/0323; H10D 62/299; H10P 30/204; H10P 30/21; H10P 32/1406; H10P 32/171
See application file for complete search history.

(56) References Cited

U.S. PATENT DOCUMENTS

| | | | | |
|---|---|---|---|---|
| 2009/0057760 A1 | | 3/2009 | Cho | |
| 2014/0027854 A1 | * | 1/2014 | Asenov ................ | H10D 64/671 438/151 |
| 2015/0263168 A1 | | 9/2015 | Hsiao et al. | |
| 2017/0213769 A1 | | 7/2017 | Cheng et al. | |

FOREIGN PATENT DOCUMENTS

| | | |
|---|---|---|
| WO | 2014020403 A1 | 2/2014 |

OTHER PUBLICATIONS

INPI Search Report and Written Opinion for priority application, FR Appl. No. 2211477, report dated May 17, 2023, 9 pgs.

* cited by examiner

*Primary Examiner* — Fernando L Toledo
*Assistant Examiner* — Adam S Bowen
(74) *Attorney, Agent, or Firm* — Crowe & Dunlevy LLC

(57) ABSTRACT

A transistor includes a source region, a drain region and a body region arranged in a semiconductor layer. A gate region tops the body region. The body region includes a first doped layer and a second layer between the first doped layer and the gate region. The second layer is an epitaxial layer that is less heavily doped than the first doped layer.

21 Claims, 7 Drawing Sheets

MOSFET TRANSISTOR

PRIORITY CLAIM

This application claims the priority benefit of French Application for Patent No. 2211477, filed on Nov. 4, 2022, the content of which is hereby incorporated by reference in its entirety to the maximum extent allowable by law.

TECHNICAL FIELD

The present disclosure generally concerns electronic components and more particularly field-effect transistors of Metal Oxide Semiconductor Field Effect Transistor (MOSFET) type.

BACKGROUND

Metal Oxide Semiconductor Field Effect Transistor (MOSFET) type transistors are field-effect transistors comprising a conductive gate, for example, metallic, electrically insulated from a semiconductor substrate by a dielectric layer referred to in the art as a gate insulator.

Various implementations of MOSFET transistors have already been provided.

It would be desirable to at least partly overcome certain disadvantages of known implementations of MOSFET transistors.

The improvement of the electric performance of MOSFET transistors intended for radio frequency (RF) signal switching applications, also called RF switches, for example, for frequencies in the range from 400 MHz to 20 GHz, is particularly considered herein.

SUMMARY

An embodiment provides a transistor which overcomes all or part of the disadvantages of known Metal Oxide Semiconductor Field Effect Transistor (MOSFET) transistors.

An embodiment provides a transistor comprising a source region, a drain region, and a body region arranged in a semiconductor layer, and a gate region topping the body region; wherein the body region comprises a first doped layer and a second layer between the first doped layer and the gate region, the second layer being an epitaxial layer, and being less heavily doped than the first doped layer.

According to an embodiment, the doping of the first doped layer is from 2 to 10 times, for example from 5 to 10 times, heavier than the doping of the second layer.

According to an embodiment, the thickness of the second layer is greater than 10 nm, preferably greater than or equal to 15 nm, for example, equal to approximately 20 nm, and/or the thickness of the first doped layer is smaller than or equal to 50 nm, preferably smaller than 45 nm, for example equal to approximately 40 nm.

According to an embodiment, the second layer is non-intentionally doped.

According to an embodiment, the first doped layer is a layer doped by ion implantation.

According to another embodiment, the first doped layer is a doped epitaxial layer.

According to an embodiment, the source region, the drain region, and the second layer are flush with a first surface of the semiconductor layer.

According to an embodiment, the transistor further comprises an insulating layer in contact with a second surface of the semiconductor layer, the first doped layer being in contact with said insulating layer.

According to an embodiment, the transistor further comprises a gate insulator layer between the gate region and the second layer.

According to an embodiment, the second layer corresponds to, or includes, a channel-forming region of the transistor.

According to an embodiment, the transistor further comprises a diffusion stop layer, for example, made of silicon carbide, between the first doped layer and the second layer.

An embodiment provides a method of manufacturing a transistor comprising a source region, a drain region, and a body region arranged in a semiconductor layer, and a gate region topping the body region, the method comprising a step of forming of the body region comprising: forming a first doped layer; and forming by epitaxial growth a second layer topping the first doped layer, the epitaxial growth being configured so that the second layer is less heavily doped than the first doped layer.

According to an embodiment, the epitaxial growth is configured so that the second layer is non-intentionally doped.

According to an embodiment, the step of forming of the body region comprises: the etching of an initial semiconductor layer down to a depth smaller than the thickness of said initial semiconductor layer; the forming of the first doped layer comprising the doping, for example by ion implantation, of the non-etched thickness of the initial semiconductor layer; and the forming by epitaxial growth of the second layer being carried out after the doping of the first doped layer; the thickness of the second layer being for example substantially equal to, or even slightly greater than, the etching depth.

According to a specific embodiment, the step of forming of the body region further comprises an anneal step carried out after the doping.

According to an embodiment, the step of forming of the body region comprises: etching an initial semiconductor layer substantially across the entire thickness of said initial semiconductor layer; forming the first doped layer comprising an epitaxial growth with a dopant on the etched initial semiconductor layer; and forming by epitaxial growth the second layer being carried out after the epitaxial growth with a dopant of the first doped layer; the thickness of the first doped layer being, for example, smaller than the thickness of the initial semiconductor layer, and the thickness of the second layer being, for example, substantially equal to, or slightly greater than, the thickness of the initial semiconductor layer minus the thickness of the first doped layer.

According to an embodiment, the method further comprises a step of deposition of a diffusion stop layer, for example made of silicon carbide, between the first doped layer and the second layer.

An embodiment provides an electronic device comprising at least one transistor according to an embodiment.

An embodiment provides a radio frequency switch comprising at least one transistor according to an embodiment.

BRIEF DESCRIPTION OF THE DRAWINGS

The foregoing features and advantages, as well as others, will be described in detail in the rest of the disclosure of specific embodiments given by way of illustration and not limitation with reference to the accompanying drawings, in which.

DETAILED DESCRIPTION

Figure 1:
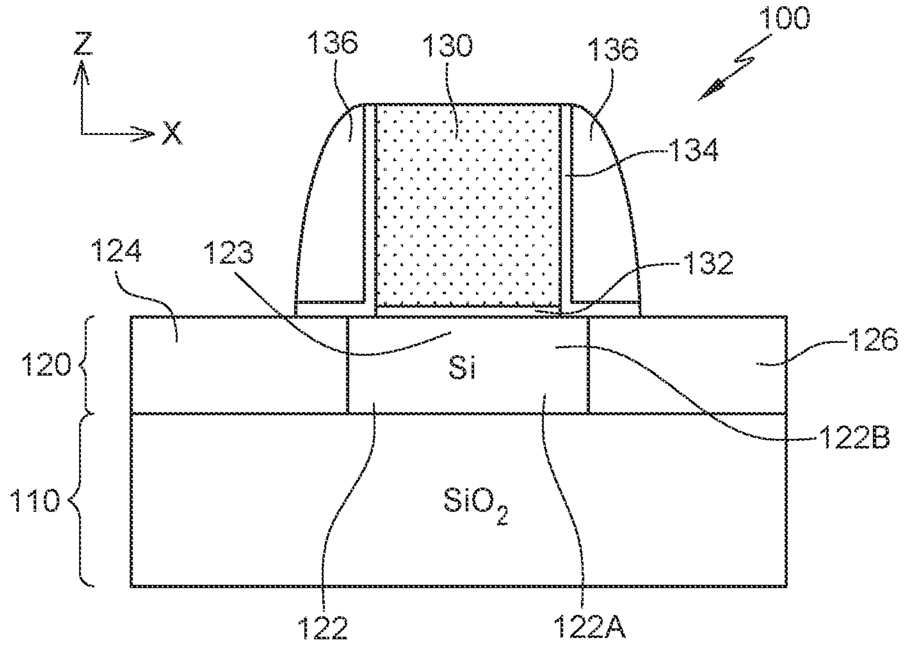
FIG. 1 shows, in a cross-section view, an example of an electronic device comprising a MOSFET transistor of Silicon on Insulator (SOI) type.

Like features have been designated by like references in the various figures. In particular, the structural and/or functional features that are common among the various embodiments may have the same references and may dispose identical structural, dimensional and material properties.

For the sake of clarity, only the steps and elements that are useful for the understanding of the described embodiments have been illustrated and described in detail. In particular, not all the steps of a Metal Oxide Semiconductor Field Effect Transistor (MOSFET) transistor have been described, since they are implementable with usual methods of microelectronics. Similarly, not all the details of the MOSFET transistors have been described. Further, the applications that the described transistors may have not all been detailed.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., it is referred, unless specified otherwise, to the orientation of the drawings or to a MOS transistor in a normal position of use.

In the following description, a length corresponds to a dimension in a first lateral direction of a MOSFET transistor, which corresponds to the X direction observed in the drawings, corresponding to a direction parallel to the conduction direction of the transistor, a thickness or a depth corresponds to a dimension in the vertical Z direction (perpendicular direction) observed in the drawings, and a width corresponds to a dimension in a second lateral Y direction, orthogonal to the X direction. Thus, there is called channel length of the transistor the dimension, along the X direction, of a channel-forming region of the transistor, substantially corresponding to the distance between a source region and a drain region of the transistor.

In the following description, when reference is made to an epitaxial layer, it is referred to a layer formed by epitaxial growth.

In the following description, for simplification, a MOSFET transistor may be called a transistor.

The transistors shown in the following description are, for example, N-channel MOS transistors (NMOS), that is, transistors having N-type doped source and drain regions, for example doped with arsenic or phosphorus atoms, while the body region is P-type doped, for example, doped with boron atoms.

As a variant, the transistors may be P-channel MOS transistors (PMOS), that is, transistors having P-type doped source and drain regions, for example, doped with boron atoms, while the body region is N-type doped, for example, doped with arsenic or phosphorus atoms.

Unless specified otherwise, the expressions "about", "approximately", "substantially", and "in the order of" signify plus or minus 10%, preferably of plus or minus 5%.

FIG. 1 shows, in a cross-section view, an example of an electronic device comprising a MOSFET transistor 100 formed inside and on top of a semiconductor layer 120. The device comprises a buried insulating layer 110, under semiconductor layer 120. Layers 110 and 120 correspond, for example, to a Silicon on Insulator (SOI) type stack for a substrate, the device then comprising a silicon substrate in contact with and under buried insulating layer 110 (this substrate not shown in FIG. 1). Semiconductor layer 120 is, for example, on top of and in contact with buried insulating layer 110.

Semiconductor layer 120 is, for example, made of silicon, for example, of single-crystal silicon, and buried insulating layer 110 is, for example, made of silicon dioxide ($SiO_2$).

Transistor 100 comprises a source region 124 and a drain region 126 formed in a region of semiconductor layer 120 called body region (body) 122.

An upper portion 123 of body region 122, between source region 124 and drain region 126, forms the channel-forming region of transistor 100, or "channel region". As an example, the source 124, drain 126, and body 122 regions are flush with the upper surface of semiconductor layer 120.

Transistor 100 further comprises a gate region 130 located above body region 122, for example, above channel region 123. Gate region 130 is, for example, made of polysilicon.

Gate region 130 is separated from body region 122 by an insulating layer 132, referred to in the art as a gate insulator layer, or gate insulator. As an example, the gate insulator is made of silicon dioxide ($SiO_2$) and has, for example, a thickness in the range from 1 nm to 10 nm.

As an example, in FIG. 1, gate insulator layer 132 is on top of and in contact with semiconductor layer 120 and gate region 130 is on top of and in contact with gate insulator layer 132.

On either side of gate region 130, on portions of semiconductor layer 120 not covered with said gate region, and on the lateral walls (sides) of gate region 130, transistor 100 comprises a thin protection oxide layer 134, for example a $SiO_2$ layer.

Further, transistor 100 comprises an insulating spacer 136 which coats the sides of gate region 130 covered with oxide layer 134 and which extends on the portions of semiconductor layer 120 covered with oxide layer 134. Insulator layer 136 is, for example, made of silicon nitride (SiN).

It is generally desired for the lowest possible resistance Rch to be present in body region 122, and in particular in channel region 123.

This may be desired for in applications where there is a need to minimize the on-state resistance of the transistor, known under denomination "Ron", without for this to impact other performance factors of the transistor, such as for example the off-state capacitance, known under denomination "Coff" which may also be desired to be minimized, and voltage Vmax, or voltage RF Vmax for RF (radio frequency) applications, which is the maximum voltage that can be applied to a transistor, which may also be desired to be maximized.

The minimizing of product Ron*Coff is, for example, desired in electronic components used in RF (radio frequency) communication applications, for example, for RF signal switching technologies (RF switch) and/or front-end radio antenna modules (FEM).

To maximize voltage RF Vmax, a solution may comprise optimizing the doping profile by ion implantation of body region 122 in the Z direction between buried insulating layer 110 and gate insulator layer 132, for example, by more heavily doping a lower stratum 122A of the body region close to buried insulating layer 110, and by more lightly doping, or even by not doping, an upper stratum 122B of the body region close to gate insulator layer 132, for example, substantially corresponding to channel-forming region 123.

A limitation to this solution originates from the fact that it is not always easy to control the diffusion of dopants, and thus to obtain the desired doping profile. Further, it may turn out to be insufficient to enable to decrease the Ron without impacting voltage RF Vmax.

A solution to decrease resistor Ron while not decreasing voltage RF Vmax may comprise modifying the crystal structure of the semiconductor layer, for example, forming a strained silicon layer on an unstrained semiconductor layer, or directly on the buried insulating layer.

However, this solution has the disadvantage of being longer and more expensive in terms of transistor manufacturing, particularly due to the cost of manufacturing and/or of purchase of a substrate with a strained silicon layer. Further, even if it does not impact voltage RF Vmax, it may turn out to be insufficient to enable to decrease the Ron.

A MOSFET transistor is disclosed herein that enables meeting the previously-described needs for improvement, and overcomes all or part of the disadvantages of the previously-described transistors. In particular, a MOSFET transistor is provided which enables to improve the tradeoff between the Coff*Ron, which is desired to be minimized by minimizing the Ron, and voltage RF Vmax, which is desired to be maximized or at least to be impacted as little as possible, and this, without adding complexity to the transistor manufacturing method, in particular without adding time-consuming and expensive steps.

Embodiments of MOSFET transistors will be described hereafter. The described embodiments are non-limiting and various variants will occur to those skilled in the art based on the indications of the present description.

Figure 2:
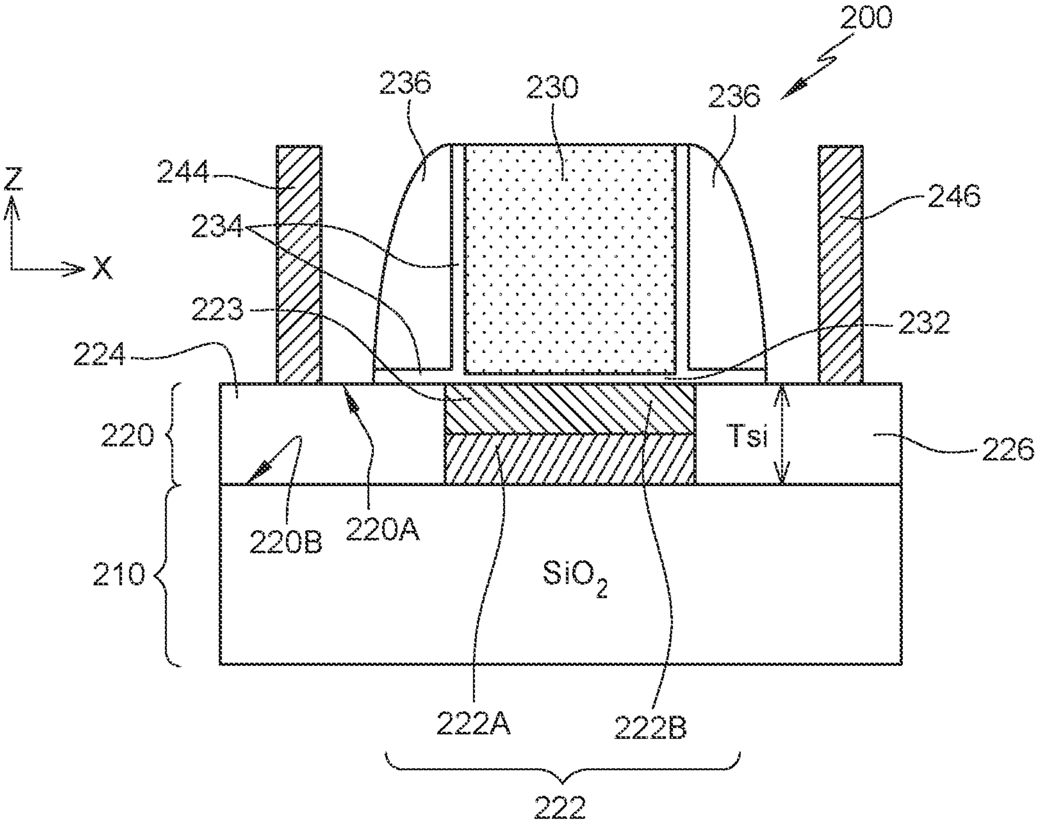
FIG. 2 shows, in a cross-section view, an electronic device comprising a MOSFET transistor.

FIG. 2 shows, in a cross-section, an electronic device comprising a MOSFET transistor 200.

Similarly to the transistor 100 of FIG. 1, MOSFET transistor 200 is formed inside and on top of a semiconductor layer 220. The device comprises a buried insulating layer 210, under semiconductor layer 220. Layers 210 and 220 correspond, for example, to an SOI-type stack for a substrate, the device then comprising a semiconductor substrate in contact with and under buried insulating layer 210 (that substrate not shown in FIG. 2). Semiconductor layer 220 is, for example, on top of and in contact with buried insulating layer 210.

Semiconductor layer 220 is, for example, made of silicon, for example, of single-crystal silicon. Semiconductor layer 220 may have a thickness in the range from 10 nm to 500 nm, for example from 50 nm to 200 nm, for example, in the order of 60 nm or in the order of 160 nm.

As an example, buried insulating layer 210 is made of silicon dioxide ($SiO_2$). Buried insulating layer 210 may have a thickness in the range from 100 nm to 600 nm, for example from 200 nm to 450 nm, for example, in the order of 400 nm.

Transistor 200 comprises a source region 224 and a drain region 226 formed in a region of semiconductor layer 220, referred to in the art as the body region 222.

An upper portion of body region 222, between source region 224 and drain region 226, forms the channel region 223 of transistor 200.

As an example, the source 224, drain 226, and body 222 regions are flush with the upper surface 220A of semiconductor layer 220.

Transistor 200 further comprises a gate region 230 located above body region 222, for example, above channel region 223. The gate region is, for example, made of polysilicon.

Gate region 230 is separated from body region 222 by an insulating layer 232 (gate insulator). As an example, the gate insulator is made of silicon dioxide ($SiO_2$).

The gate insulator has, for example, a thickness in the range from approximately 1 nm to 10 nm. The gate insulator may have a thickness in the range from approximately 1 to 4.5 nm, for example, approximately 2.1 nm, for a transistor referred to as GO1 ("Gate Oxide 1"), that is, a transistor with a gate insulator of small thickness, or a thickness in the range from approximately 5 to 7.5 nm, for example, approximately 6.5 nm, for a transistor referred to as GO2 ("Gate Oxide 2"), that is, a transistor having a gate insulator of large thickness.

As an example, in FIG. 2, gate insulator layer 232 is on top of and in contact with semiconductor layer 220 and gate region 230 is on top of and in contact with gate insulator layer 232.

On either side of gate region 230, on portions of semiconductor layer 220 not covered with the gate region, and on the sides of gate regions 230, transistor 200 comprises a thin protection oxide layer 234, for example a $SiO_2$ layer. The thickness of the thin oxide layer is for example in the range from 2 to 10 nm, or even from 2 to 5 nm. On the sides of gate region 230, thin protection oxide layer 234 follows the shape of said gate region.

Further, transistor 200 comprises an insulating spacer 236 which coats the sides of gate region 230 covered with oxide layer 234 and which extends on the portions of semiconductor layer 220 covered with oxide layer 234. Insulating spacer 236 is, for example, made of a silicon nitride (SiN).

Transistor 200 comprises at least one source contact pad 244 electrically coupled to source region 224 and at least one drain contact pad 246 electrically coupled to drain region 226.

Transistor 200 differs from the transistor 100 of FIG. 1 essentially in that body region 222 comprises a lower doped layer (first doped layer) 222A topped with an upper layer (second layer) 222B less heavily-doped than the lower layer, for example, non-intentionally doped. Upper layer 222B is formed by epitaxial growth (epitaxial layer). According to an example, lower layer 222A is doped by ion implantation.

For example, lower layer 222A is from 5 to 10 times more heavily doped than upper layer 222B.

For example, the thickness of upper layer 222B is greater than 10 nm, preferably greater than or equal to 15 nm, for example, equal to approximately 20 nm, for example, for a thickness Tsi of semiconductor layer 220 equal to 60 nm. According to an embodiment, the thickness of layer 222B is smaller than 30 nm.

According to an example, the thickness of upper layer 222B is smaller than or equal to the thickness of the channel region.

According to another example, upper layer 222B substantially corresponds to, or includes, channel region 223.

The upper layer 222B, non or lightly-doped, of body region 222 enables to improve the conduction and thus to decrease the voltage resistance of the transistor, by lowering the threshold voltage, while lower layer 222A, more heavily doped, enables to increase the resistivity and thus to increase voltage RF Vmax, while enabling to keep the voltage in the channel area by the gate voltage when the transistor is non-conductive. The upper layer is epitaxially grown to be formed after the implantation of the body region, with the purpose of seeing no implant, or to see as little as possible thereof, and to remain as intrinsic as possible.

FIG. 3A, FIG. 3B, FIG. 3C, FIG. 3D, FIG. 3E, FIG. 3F, and FIG. 3G are cross-section views partially and schematically showing successive steps of an example of manufacturing of a MOSFET transistor 200 according to the embodiment of FIG. 2.

In FIGS. 3A to 3G, it is considered, for example, that the semiconductor layer is a silicon layer (Si) and that the buried insulating layer is a silicon oxide layer ($SiO_2$), but this is not limiting.

Figure 3A:
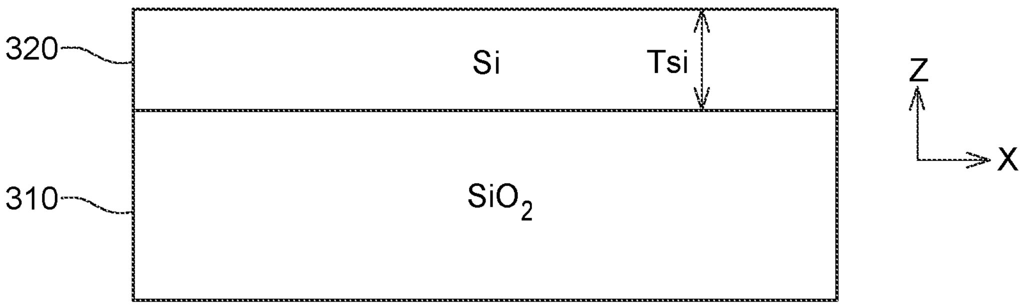
FIG. 3A, FIG. 3B, FIG. 3C, FIG. 3D, FIG. 3E, FIG. 3F, and FIG. 3G are cross-section views partially and schematically illustrating successive steps of an example of a method of manufacturing the MOSFET transistor of FIG. 2.

FIG. 3A shows an initial structure comprising a buried insulating layer 310 ($SiO_2$), topped with an initial semiconductor layer 320 (Si) of thickness Tsi; this structure corresponding to the SOI substrate.

Figure 3B:
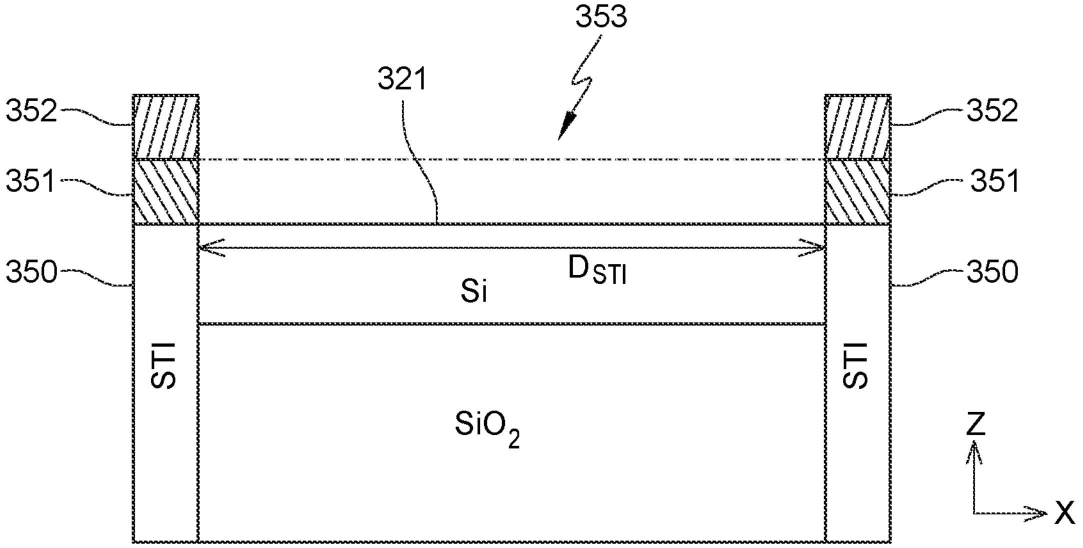

FIG. 3B corresponds to a structure obtained at the end of: the forming of two insulating trenches 350 in semiconductor layer 320, and in buried insulating layer 310, for example, trenches filled with silicon oxide, for example, of the Shallow Trench Isolation (STI) type; the forming of a mask 351 on initial semiconductor layer 320 and on trenches 350; the forming of a resin pattern 352 on mask 351, the resin pattern comprising an opening 353 between the two insulating trenches; the etching of mask 351 through the opening 353 of the pattern, to form in the mask an opening substantially corresponding to said opening of the pattern, to access a portion 321 of the initial semiconductor layer, said portion being located between the two insulating trenches 350.

For example, the mask is deposited in the form of a layer. For example, the mask layer is deposited by a chemical vapor deposition (CVD) with, as a precursor, tetraethyl orthosilicate (TEOS) to form a $SiO_2$ layer.

For example, the resin pattern is formed by photolithography. For example, the resin pattern is formed vertically in line with trenches 350.

Insulating trenches 350 are provided for insulating the portion 321 of the semiconductor layer inside and on top of which the MOSFET transistor will be formed. They are separated by a length $D_{STI}$ in the X direction. The length of portion 321 of the initial semiconductor layer is substantially equal to the distance $D_{STI}$ between the two insulating trenches 350.

The insulating trenches are shown as being formed in the semiconductor layer and in the buried insulating layer. As variants, the insulating trenches may emerge at the limit between the semiconductor layer and the buried insulating layer, or cross a portion of the thickness of the buried insulating layer.

Figure 3C:
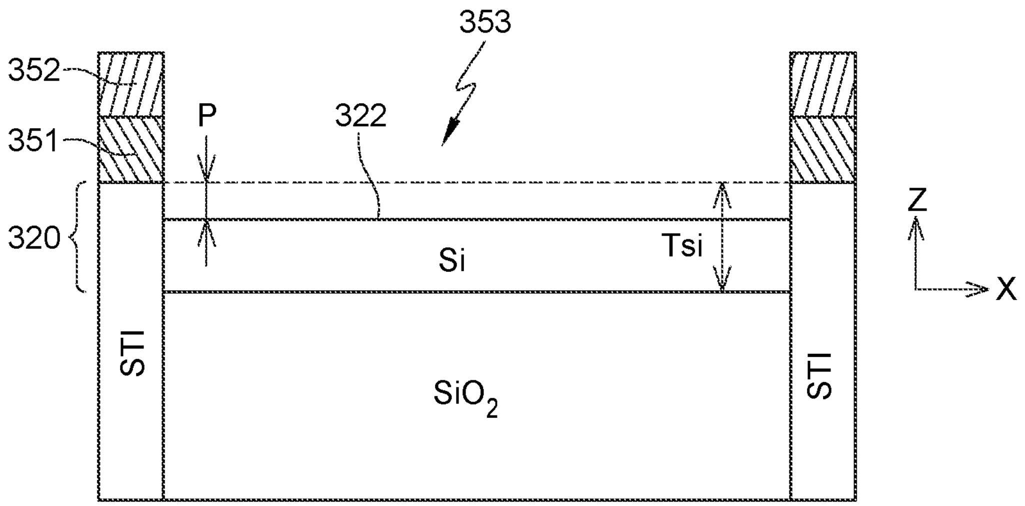

FIG. 3C corresponds to a structure obtained at the end of a step of partial etching of the portion 321 of semiconductor layer 320 through the opening 353 of mask 351, forming an etch mask. The etching of portion 321 is called partial in that it is performed down to a depth P smaller than the thickness Tsi of semiconductor layer 320.

The partial etching is, for example, a dry etching or is performed by thermal oxidation.

Figure 3D:
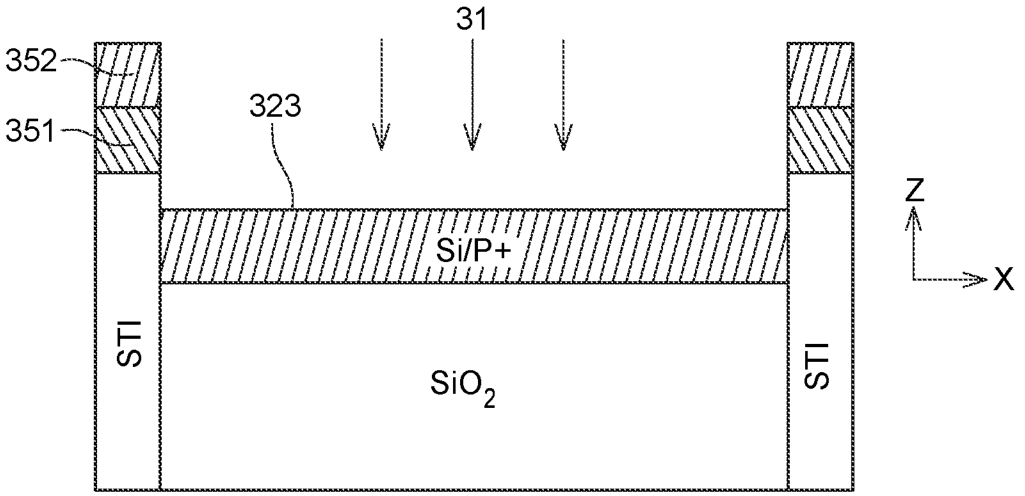

FIG. 3D corresponds to a structure obtained at the end of a step of doping 31 of the portion 322 of semiconductor layer 320 remaining after the partial etching, for example, by ion implantation, to form a doped semiconductor layer 323, for example, a doped silicon layer (Si/P+).

For an NMOS transistor such as illustrated, the ion implantation may use P-type dopants such as boron (B). For a PMOS transistor, the ion implantation may use N-type dopants such as arsenic (As) or phosphorus (P).

As shown, the doping step is preferably carried out after the partial etching of the silicon layer. As a variant, the doping step may be carried out before the partial etching of the silicon layer.

Figure 3E:
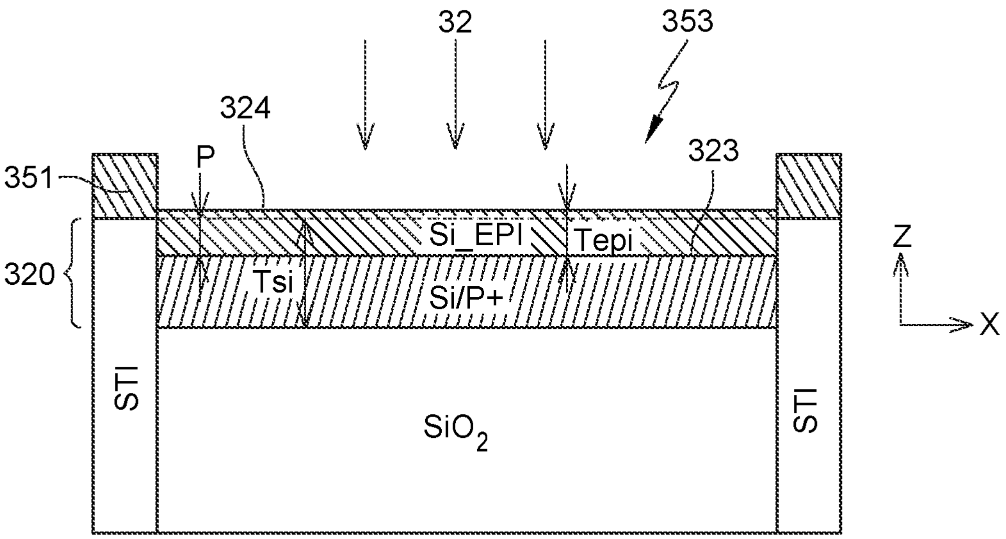

FIG. 3E corresponds to a structure obtained at the end of: the removal of resin pattern 352; and then a step of epitaxial growth to form an epitaxial layer 324, for example a silicon epitaxial layer (Si-EPI), on doped semiconductor layer 323, in the opening 353 of mask 351.

As a variant, the removal of resin pattern 352 may be performed before the doping step, or even before the partial etching step.

Body region 222 is located in this stack of doped semiconductor layer 323 and of epitaxial layer 324. Epitaxial layer 324 is preferably not initially doped.

The thickness Tepi of epitaxial layer 324 may be substantially equal to the depth P of etching of semiconductor layer 320, or slightly greater than this depth, as shown. For example, the thickness of the epitaxial layer compensates for the depth of partial etching of the semiconductor layer to regain the thickness of the initial semiconductor layer, for example, to avoid degrading the junction capacitances.

The epitaxial growth step may be carried out with a gas comprising a semiconductor, for example silicon, with no dopant, to form a non-intentionally doped epitaxial layer. For example, the epitaxial growth is performed under hydrogen ($H_2$), for example with a flow rate in the range from 30 to 80 standard liters per minute and/or a pressure in the range from 15 to 60 TPa according to the type of equipment.

The epitaxial growth step is, for example, preceded by a step of cleaning of the surface on which the growth is performed.

The epitaxial growth step is, for example, followed by a step of annealing 32 the doped semiconductor layer 323, as illustrated in FIG. 3E.

As a variant, anneal step 32 may be carried out before the epitaxial growth step.

As a variant, semiconductor layer 320 is not etched. In other words, there is no partial etching, and upper epitaxial layer 222A is formed on portion 321 of the initial semiconductor layer, in this case, non-etched.

Figure 3F:
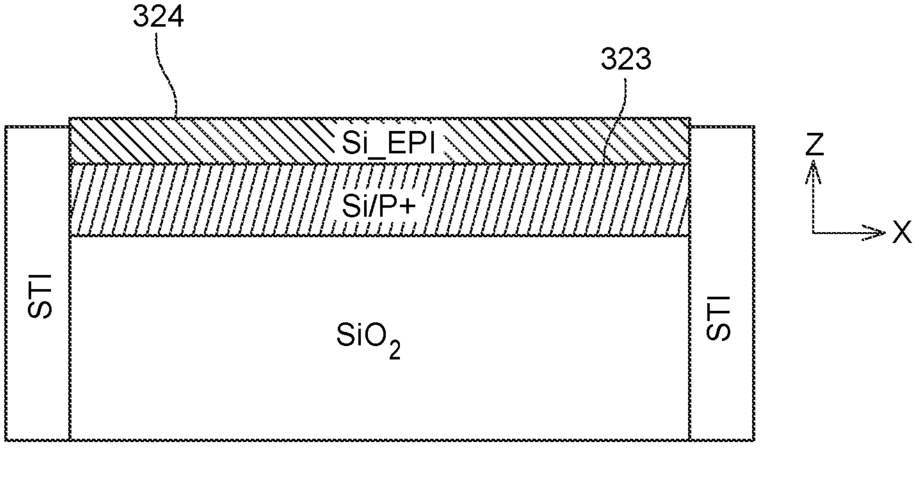

FIG. 3F corresponds to a structure obtained at the end of the removal of mask 351.

Figure 3G:
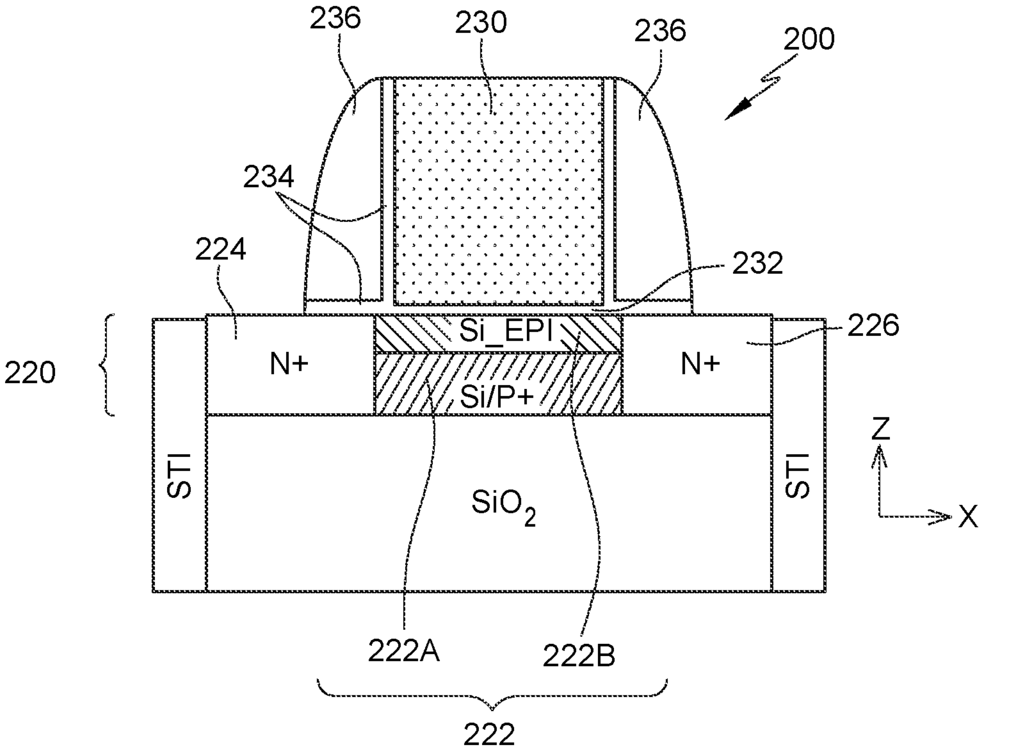

FIG. 3G corresponds to a structure, similar to the structure 200 of FIG. 2 (the contacts are not shown), obtained at the end of standard steps of forming of a gate insulator layer 232 on epitaxial layer 324, of a gate region 230 on gate insulator 232, of an oxide layer 234 on the gate region, of spacers 236 on oxide layer 234, and of the source 224 and drain 226 regions by doping of two portions, distant in the X direction, of the stack of doped semiconductor layer 323 (the undoped P portion of which becomes lower layer 222A) and of epitaxial layer 324 (the undoped P portion of which becomes upper layer 222B).

For an NMOS transistor such as illustrated, the doping of the source and drain regions may use N-type dopants such as arsenic (As) or phosphorus (P). For a PMOS transistor, the doping of the source and drain regions may use P-type dopants such as boron (B).

Body region 222 is thus formed by the stacking of a lower doped layer 222A (corresponding to the portion of the doped semiconductor layer 323 located between the source 224 and drain 226 regions) and of an upper epitaxial layer 222B less heavily doped than lower layer 222A (corresponding to the portion of epitaxial layer 324 located between the source 224 and drain 226 regions). For example, the doping of lower layer 222A is from 2 to 10 times heavier than the doping of upper layer 222B, for example from 5 to 10 times heavier than the doping of upper layer 222B.

Thus, the manufacturing of the MOSFET transistor of FIG. 2 may be carried out in a standard MOSFET transistor manufacturing environment.

Figure 4:
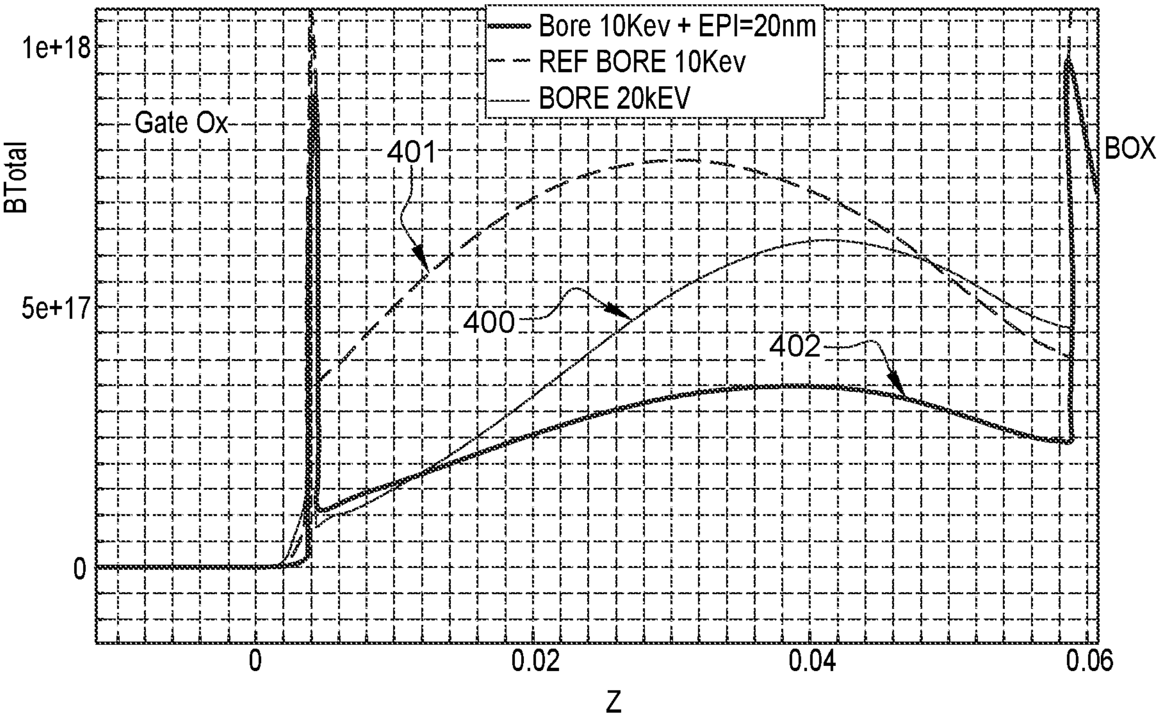
FIG. 4 shows compared doping profiles of the body region of three different MOSFET transistors.

FIG. 4 shows compared doping profiles, in the Z direction, of the body region of three different MOSFET transistors. The thickness Tsi of the semiconductor layer, substantially corresponding to the thickness of the body region, is equal to approximately 60 nm.

Curves 401 and 402 correspond to two profiles of P doping by ion implantation with boron, respectively at 10 KeV and at 20 KeV, of the body region in the Z direction between the gate insulator layer (Gate Ox) and the buried insulating layer (BOX), in which a heavier doping close to the buried insulating layer, and a lighter doping close to the gate insulator layer, are targeted. It can be observed that, according to the doping energy used, there is favored either a lightly-doped area close to the gate insulator layer, or an heavily-doped area close to the buried insulating layer, but a lightly-doped area close to the gate insulator layer and a heavily-doped area close to the buried insulating layer are not combined.

Curve 400 corresponds to a doping profile, in the Z direction, between the gate insulating layer (Gate Ox) and the buried insulating layer (BOX), of the body region of a MOSFET transistor of FIG. 2, with a 20-nm upper epitaxial layer, and a lower layer P-type doped by ion implantation with boron at 10 KeV. It can be observed that it is succeeded in combining a lightly-doped area close to the gate insulator layer and a heavily-doped area close to the buried insulating layer. In other words, it is succeeded in better controlling the doping profile in the body region, due to the presence of the stack of the lower doped layer and of the less-heavily or non-doped upper epitaxial layer.

Figure 5:
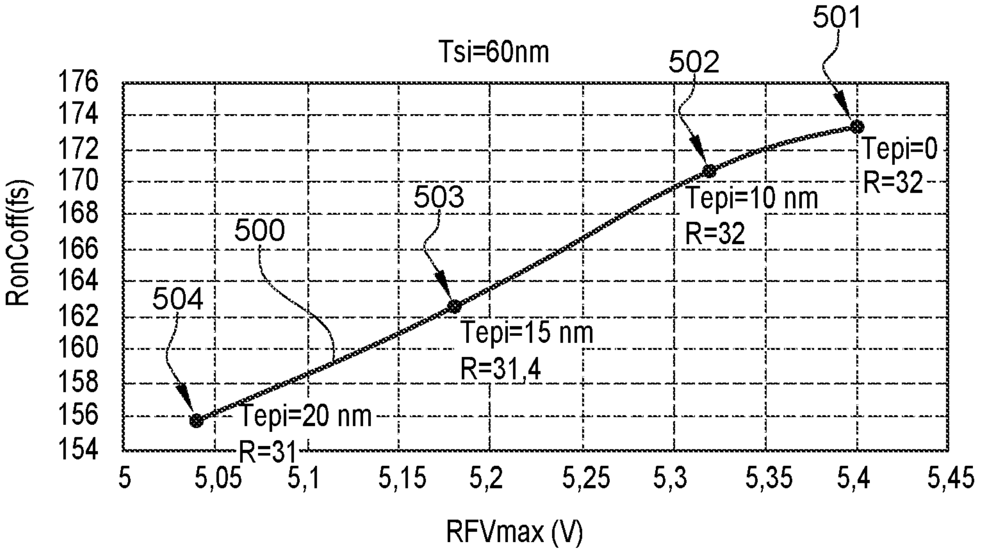
FIG. 5 shows results of compared tests of a plurality of MOSFET transistors having their body region comprising different epitaxial layer thicknesses.

FIG. 5 shows results of compared tests of a plurality of MOSFET transistors having their body region comprising different epitaxial layer thicknesses. The results are given for a thickness Tsi of the semiconductor layer, substantially corresponding to the thickness of the body region, equal to 60 nm. The results provide product Ron*Coff according to RF Vmax, for a plurality of points 501, 502, 503, 504 coupled by a curve 500. Point 501 corresponds to a null thickness, the ratio R between the Ron*Coff and the RF Vmax being equal to 32. Point 502 corresponds to a 10-nm thickness, with a product Ron*Coff smaller than that of point 501, the ratio R between the Ron*Coff and the RF Vmax being equal to 32. This signifies that the Ron*Coff is decreased, but that the RF Vmax is accordingly decreased. Point 503 corresponds to a 15-nm thickness, with a product Ron*Coff smaller than that of point 502, the ratio R between the Ron*Coff and the RF Vmax being equal to 31.4. This signifies that the Ron*Coff is decreased, and that the RF Vmax is not accordingly decreased, that is, it is acted on Ron*Coff while having less impact on the RF Vmax. Point 504 corresponds to a 20-nm thickness, with a product Ron*Coff smaller than that of point 503, the ratio R between the Ron*Coff and the RF Vmax being equal to 31. This signifies that the Ron*Coff is decreased, and that the RF Vmax is not accordingly decreased, that is, it is acted on Ron*Coff while having still less impact on the RF Vmax.

Thus, it can be observed that it can be acted on the thickness of the epitaxial layer of the body region to decrease the Ron, and thus decrease product Ron*Coff, while less impacting the RF Vmax.

Figure 6:
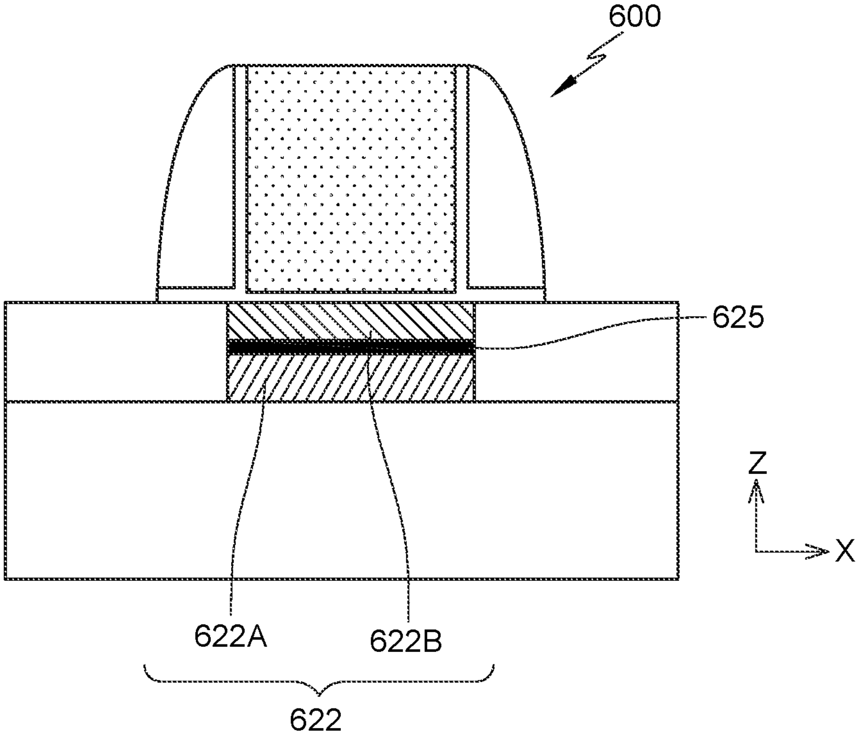
FIG. 6 shows, in a cross-section view, an electronic device comprising a MOSFET transistor.
Figure 7:
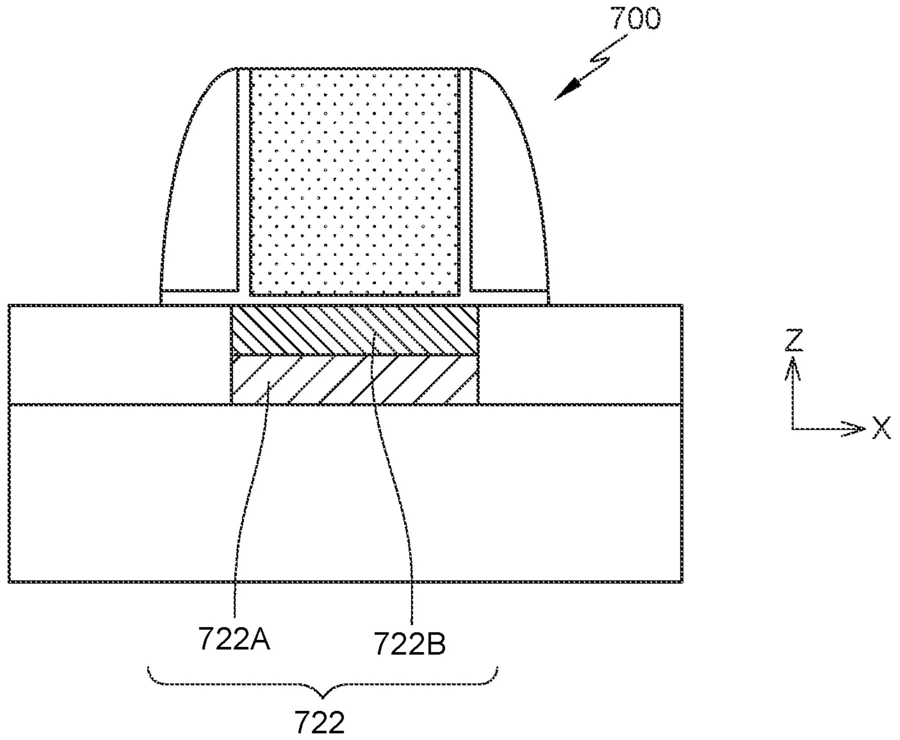
FIG. 7 shows, in a cross-section view, an electronic device comprising a MOSFET transistor.

During the method, for example, during the step of anneal of the lower layer of the body region for the diffusion of the dopants after ion implantation, the doping of the lower layer may diffuse into the upper layer, for example modifying the final doping profile with respect to the targeted doping profile. FIGS. 6 and 7 and the following description correspond to implementations particularly aiming at decreasing this diffusion.

FIG. 6 shows, in a cross-section view, an electronic device comprising a MOSFET transistor 600. The transistor 600 of FIG. 6 differs from the transistor 200 of FIG. 2 mainly in that it comprises a diffusion stop layer 625 between the first layer 622A and the second layer 622B of the body region 622. Stop layer 625 aims at limiting, or even stopping, the diffusion of dopants from first layer 622A to second layer 622B.

The diffusion stop layer is, for example, made of silicon carbide (SiC). When the semiconductor layer is made of silicon, the SiC layer may be formed by carbon implantation or, preferably, by epitaxy, on the first layer 622A which is made of silicon, before the forming of second layer 622B by epitaxial growth.

FIG. 7 shows, in a cross-section view, an electronic device comprising a MOSFET transistor 700. The transistor 700 of FIG. 7 differs from the transistor 200 of FIG. 2 mainly in that the first layer 722A is an epitaxial and doped layer.

This first epitaxial and doped layer 722A may be formed by etching the portion 321 of initial semiconductor layer 320 all throughout thickness Tsi, and then by performing a step of epitaxial growth with a dopant, before the step of epitaxial growth with no dopant intended to form the second epitaxial layer 722B.

The step of epitaxial growth with a dopant is, for example, carried out with a gas comprising silicon and a P-type dopant, for example, boron, to form a P-doped epitaxial silicon layer (NMOS transistor), or with a gas comprising silicon and an N-type dopant, for example, phosphorus or arsenic, to form an N-doped epitaxial layer (PMOS transistor).

The step of epitaxial growth with a dopant is, for example, carried out with hydrogen ($H_2$), a precursor of Si such as dichlorosilane (DCS), silicon tetrahydride ($SiH_4$), or methylsilane ($SiH_3CH_3$), or even a precursor of germanium (Ge) such as germanium tetrahydride ($GeH_4$), and a dopant such as diborane ($B_2H_6$) (for example, at 2%) for a P doping, or arsenic trihydride ($AsH_3$) (for example, at 25 ppm or at 1,000 ppm) for an N doping.

Using an epitaxial growth with a dopant to form the first layer 722A of body region 722 enables to do away with an anneal step, since by epitaxy, the dopants are activated during the growth, and thus to limit the diffusion of dopants to second layer 722B.

Figure 8:
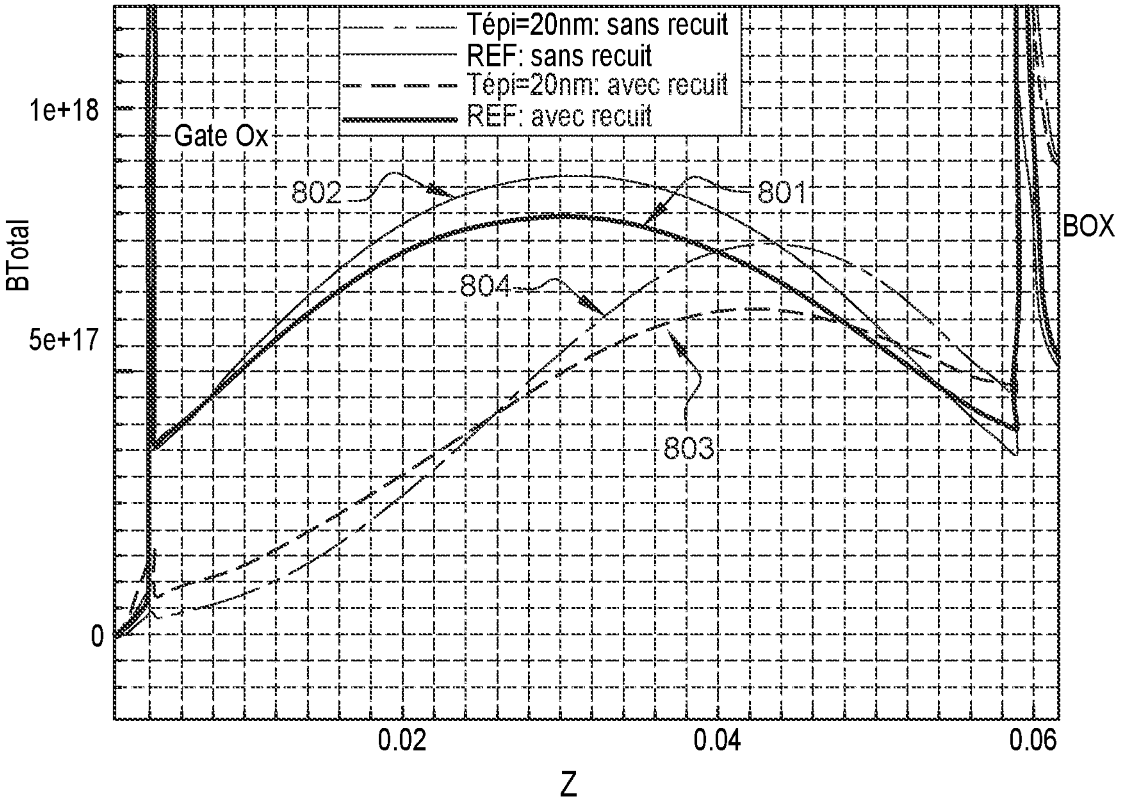
FIG. 8 shows compared doping profiles of the body region of two different MOSFET transistors, with or without anneal.

FIG. 8 shows compared doping profiles of the body region, in the Z direction, of two different MOSFET transistors, with or without anneal. The thickness Tsi of the semiconductor layer, substantially corresponding to the thickness of the body region, is equal to approximately 60 nm.

Curves 801 and 802 correspond to two doping profiles by ion implantation, in the Z direction between the gate insulator layer (Gate Ox) and the buried insulating layer (BOX), of the body region of a MOSFET transistor with no epitaxial layer respectively with and without anneal.

Curves 803 and 804 correspond to two doping profiles, in the Z direction between the gate insulator layer (Gate Ox) and the buried insulator layer (BOX), of the body region of a MOSFET transistor according to an embodiment, with an epitaxial layer thickness of 20 nm, respectively with and without anneal. It can be observed that, with no anneal, and for the transistor according to the embodiment, it is succeeded in decreasing the doping of the lightly-doped region close to the gate insulator.

It is thus advantageous to be able to do away with the anneal step, for example, by forming first layer 722A by epitaxial growth with a dopant, as described in relation with FIG. 7. The anneal parameters may also be adapted, when the anneal step is necessary. For example, the anneal temperature and/or the anneal time may be decreased, for example with very strong temperature rise ramps.

Thus, the embodiments enable to minimize the product Ron*Coff of a MOSFET transistor, while limiting the impact on other performance factors of the transistor, for example the maximum applicable voltage RF Vmax. Further, this effect may cumulate with other improvements to minimize product Ron*Coff and/or to maximize the RF Vmax, for example, with other improvements made to the structure of the MOSFET transistor.

The embodiments may find applications for electronic components used in RF communication applications, for example, for RF signal switching technologies (RF switch) and/or radio front-end modules (FEM). For RF switches, the embodiments particularly enable to minimize the loss of information of the switch without changing it, for example, the voltage resistance and the insulation from the environment.

Various embodiments and variants have been described. Those skilled in the art will understand that certain features of these various embodiments and variants may be combined, and other variants will occur to those skilled in the art.

Finally, the practical implementation of the described embodiments and variants is within the abilities of those skilled in the art based on the functional indications given hereabove.

The invention claimed is:

1. A transistor, comprising:
- a semiconductor layer;
- a source region, a drain region, and a body region arranged in the semiconductor layer; and
- a gate region topping the body region;
- wherein the body region comprises a first doped layer and a second layer between the first doped layer and the gate region, the second layer being an epitaxial layer, and the second layer being less heavily doped than the first doped layer; and
- a diffusion stop layer between the first doped layer and the second layer.

2. The transistor according to claim 1, wherein a doping of the first doped layer is from 2 to 10 times heavier than a doping of the second layer.

3. The transistor according to claim 1, wherein a doping of the first doped layer is from 5 to 10 times heavier than a doping of the second layer.

4. The transistor according to claim 1, wherein a thickness of the second layer is between 10 nm and 20 nm, and wherein a thickness of the first doped layer is between 40 nm and 50 nm.

5. The transistor according to claim 1, wherein the second layer is non-intentionally doped.

6. The transistor according to claim 1, wherein the first doped layer is a layer doped by ion implantation.

7. The transistor according to claim 1, wherein the first doped layer is a doped epitaxial layer.

8. The transistor according to claim 1, wherein the source region, the drain region, and the second layer are flush with a first surface of the semiconductor layer.

9. The transistor according to claim 1, further comprising an insulating layer in contact with a second surface of the semiconductor layer, the first doped layer being in contact with said insulating layer.

10. The transistor according to claim 1, further comprising a gate insulator layer between the gate region and the second layer.

11. The transistor according to claim 1, wherein the second layer comprises a channel-forming region of the transistor.

12. The transistor according to claim 1, wherein the diffusion stop layer is made of silicon carbide.

13. An electronic device comprising at least one transistor according to claim 1.

14. A radio frequency switch comprising at least one transistor according to claim 1.

15. A method of manufacturing a transistor which comprises a source region, a drain region and a body region arranged in a semiconductor layer, and a gate region topping the body region, the method comprising:
- forming the body region by:
  - forming a first doped layer;
  - forming by epitaxial growth a second layer above the first doped layer, the epitaxial growth being configured so that the second layer is less heavily doped than the first doped layer; and
  - depositing a diffusion stop layer between the first doped layer and the second layer.

16. The method according to claim 15, wherein the epitaxial growth is configured so that the second layer is non-intentionally doped.

17. The method according to claim 15, wherein forming the body region comprises:
- etching an initial semiconductor layer down to a depth smaller than a thickness of said initial semiconductor layer;
- forming the first doped layer by doping through ion implantation the non-etched thickness of the initial semiconductor layer; and
- forming by epitaxial growth the second layer after doping of the first doped layer;
- wherein a thickness of the second layer is substantially equal to or slightly greater than the depth of the etching.

18. The method according to claim 17, wherein forming the body region further comprises performing an anneal after the doping.

19. The method according to claim 15, wherein forming the body region comprises:
- etching an initial semiconductor layer across substantially an entire thickness of said initial semiconductor layer;

forming the first doped layer by epitaxial growth with a dopant on the etched initial semiconductor layer; and forming by epitaxial growth the second layer after the epitaxial growth with a dopant of the first doped layer;

wherein a thickness of the first doped layer is smaller than a thickness of the initial semiconductor layer, and wherein a thickness of the second layer is substantially equal to or greater than a thickness of the initial semiconductor layer minus the thickness of the first doped layer.

20. The method according to claim 15, wherein the diffusion stop layer is made of silicon carbide.

21. The method according to claim 15, further comprising forming the gate region after forming the body region.

* * * * *